(12) United States Patent
Chang et al.

(10) Patent No.: US 11,750,967 B2
(45) Date of Patent: Sep. 5, 2023

(54) MICROPHONE AND HEAD-MOUNTED DISPLAY

(71) Applicant: HTC Corporation, Taoyuan (TW)

(72) Inventors: Li-Hsun Chang, Taoyuan (TW); Chen-Fu Chang, Taoyuan (TW); I-Chung Wu, Taoyuan (TW); Pei-Wen Wang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 223 days.

(21) Appl. No.: 17/488,307

(22) Filed: Sep. 29, 2021

(65) Prior Publication Data
US 2023/0094428 A1    Mar. 30, 2023

(51) Int. Cl.
*H05K 1/02* (2006.01)
*H04R 1/28* (2006.01)
*H05K 1/18* (2006.01)
*H05K 1/03* (2006.01)
*H04R 1/04* (2006.01)
*H04R 31/00* (2006.01)

(52) U.S. Cl.
CPC ............ *H04R 1/2892* (2013.01); *H04R 1/04* (2013.01); *H05K 1/0393* (2013.01); *H05K 1/181* (2013.01); *H04R 31/006* (2013.01)

(58) Field of Classification Search
CPC ...... H05K 1/028; H05K 1/0393; H05K 1/189; H05K 2201/10083
See application file for complete search history.

(56) References Cited

U.S. PATENT DOCUMENTS

| | | | |
|---|---|---|---|
| 6,456,720 B1* | 9/2002 | Brimhall | H04R 25/658 381/322 |
| 2003/0068059 A1* | 4/2003 | Blok | H04R 19/016 381/361 |
| 2011/0188676 A1* | 8/2011 | Momose | H04R 3/00 381/361 |
| 2021/0289276 A1* | 9/2021 | Yang | H04R 1/083 |

* cited by examiner

*Primary Examiner* — Sherman Ng
(74) *Attorney, Agent, or Firm* — JCIPRNET (57) ABSTRACT

A microphone includes a base, at least one sound receiving element, and a flexible circuit board. The base has a plurality of supporting portions, a plurality of damping portions, and a bearing portion. The plurality of supporting portions are spaced apart from each other. Each of the plurality of damping portions is disposed on an inner surface of the corresponding supporting portion. The bearing portion is connected to the plurality of damping portions and is suspended between the plurality of supporting portions. The at least one sound receiving element is disposed on the base. The flexible circuit board is disposed on the base and has a first transmission segment. The first transmission segment is electrically coupled to the at least one sound receiving element, and the first transmission segment has a plurality of bending sections.

20 Claims, 9 Drawing Sheets

MICROPHONE AND HEAD-MOUNTED DISPLAY

BACKGROUND

Technical Field

The disclosure relates to a microphone, and particularly, to a microphone having a damping function, and to a head-mounted display in which a microphone having a damping function is adopted.

Description of Related Art

A microphone is a transducer that converts a sound wave into an electronic signal, and is mainly used to receive sound sources, such as environmental sounds and human voices. The microphone is often applied to consumer electronic products, such as smart phones, notebook computers, and head-mounted displays. The existing microphone is typically fixed on a casing of the electronic product by adhering or locking. In this case, the microphone and the casing are in contact with each other, so that vibration of the casing is directly transmitted to the microphone. Moreover, noise derived from the vibration results in poor quality of voice signals.

SUMMARY

The disclosure provides a microphone having a damping function, which absorbs and blocks vibration to prevent the microphone from interference during the sound receiving process.

The disclosure provides a head-mounted display, in which a microphone having a damping function absorbs and blocks vibration to prevent the microphone from interference during the sound receiving process.

A microphone of the disclosure includes a base, at least one sound receiving element, and a flexible circuit board. The base has a plurality of supporting portions, a plurality of damping portions, and a bearing portion. The plurality of supporting portions are spaced apart from each other. Each of the plurality of damping portions is disposed on an inner surface of the corresponding supporting portion. The bearing portion is connected to the plurality of damping portions and is suspended between the plurality of supporting portions. The at least one sound receiving element is disposed on the base. The flexible circuit board is disposed on the base and has a first transmission segment. The first transmission segment is electrically coupled to the at least one sound receiving element, and the first transmission segment has a plurality of bending sections.

A microphone of the disclosure includes a base, at least one sound receiving element, and a flexible circuit board. The base has a plurality of supporting portions, a plurality of damping portions, and a bearing portion. The plurality of supporting portions are spaced apart from each other. Each of the plurality of damping portions is disposed on an inner surface of the corresponding supporting portion. The bearing portion is connected to the plurality of damping portions and is suspended between the plurality of supporting portions. The at least one sound receiving element is disposed on the base. The flexible circuit board is disposed on the base and has a first transmission segment. The first transmission segment is electrically coupled to the at least one sound receiving element. The first transmission segment includes a first bending section, a second bending section, a third bending section, a fourth bending section, a first linear section, a second linear section, a third linear section, and a fourth linear section. The first linear section is connected between a connection segment and the first bending section of the flexible circuit board. The second linear section is connected between the first bending section and the second bending section. The third linear section is connected between the second bending section and the third bending section. In addition, the fourth linear section is connected between the third bending section and the fourth bending section.

A head-mounted display of the disclosure includes a main casing, a lens assembly, a strap assembly, and a microphone. The lens assembly is disposed in the main casing. The strap assembly is connected to the main casing to form a wearing space. The microphone is disposed in the main casing and is adjacent to the lens assembly. The microphone includes a base, at least one sound receiving element, and a flexible circuit board. The base has a plurality of supporting portions, a plurality of damping portions, and a bearing portion. The plurality of supporting portions are spaced apart from each other. Each of the plurality of damping portions is disposed on an inner surface of the corresponding supporting portion. The bearing portion is connected to the plurality of damping portions and is suspended between the plurality of supporting portions. The at least one sound receiving element is disposed on the base. The flexible circuit board is disposed on the base and has a first transmission segment. The first transmission segment is electrically coupled to the at least one sound receiving element, and the first transmission segment has a plurality of bending sections. A first linear section and a third linear section are parallel to each other, a second linear section and a fourth linear section are parallel to each other, and the first linear section and the third linear section are perpendicular to the second linear section and the fourth linear section.

Based on the foregoing, in the disclosure, the sound receiving element is mounted on the base, so that the sound receiving element is presented in a suspended state in the base. When the microphone is mounted in the main casing of the head-mounted display, the sound receiving element may not be in direct contact with the main casing of the head-mounted display. Besides, the base has the plurality of damping portions, which are respectively located on both sides of the sound receiving element. During the use of the microphone, vibration from the head-mounted display or in the environment may be absorbed by the plurality of damping portions of the base, so that the sound receiving element may not be affected by the vibration, thus reducing noise derived from the vibration.

Further, in the disclosure, the flexible circuit board having the plurality of bending sections is employed, which prevents transmission of vibration from the flexible circuit board to the sound receiving element, thus preventing the sound receiving algorithm of the microphone from interference by the vibration.

DESCRIPTION OF THE EMBODIMENTS

Figure 1A:
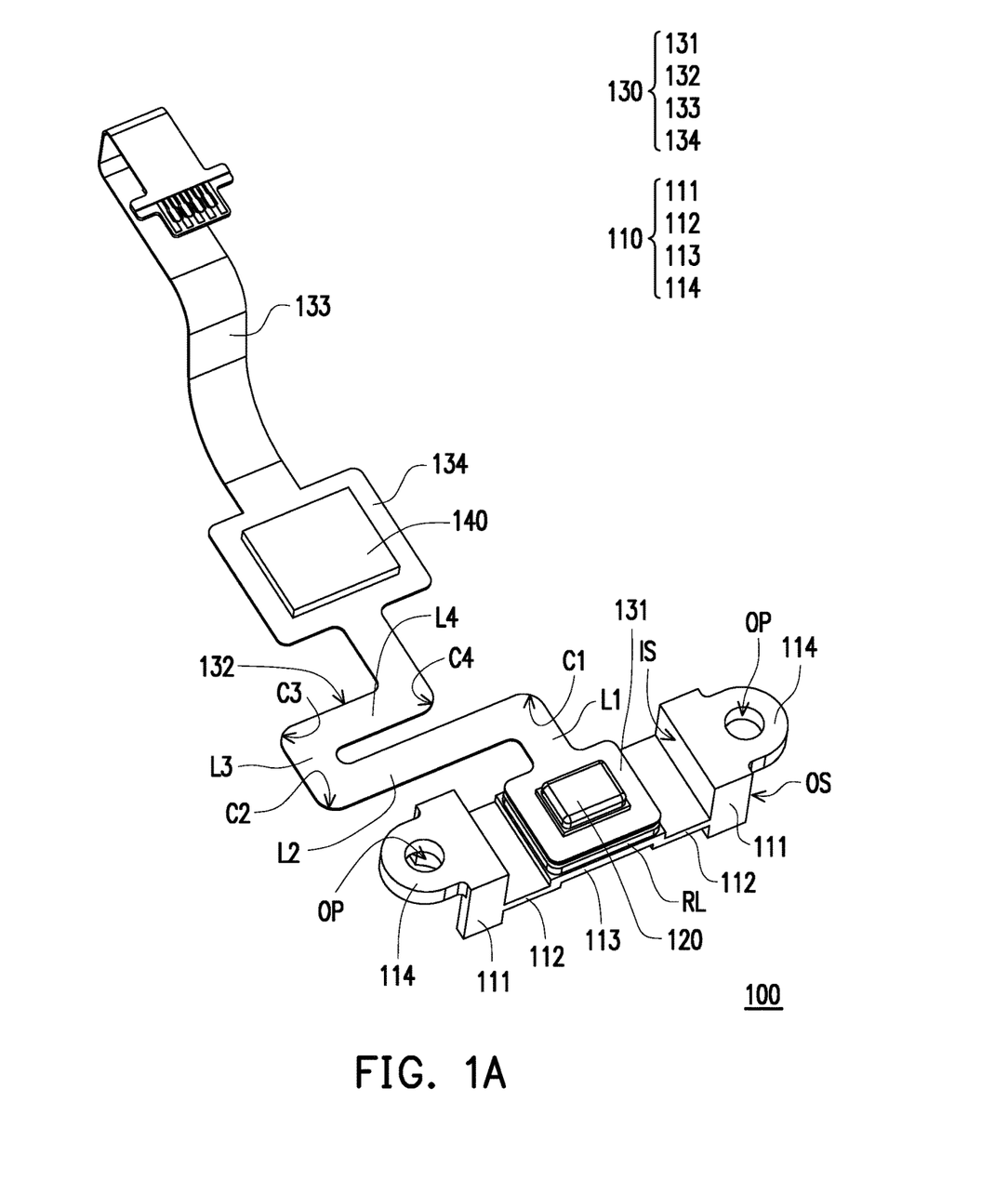
FIG. 1A is a schematic perspective view of microphone according to an embodiment of the disclosure.
Figure 1B:
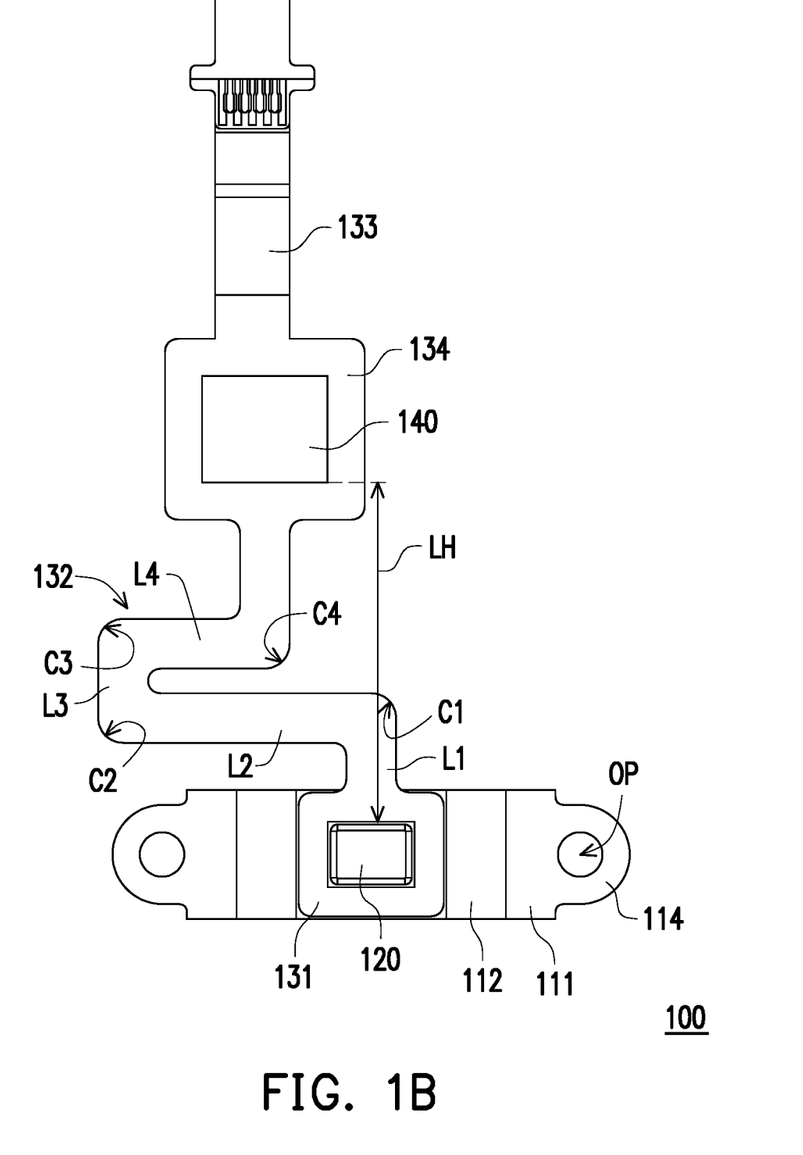
FIG. 1B is a schematic top view of the microphone of FIG. 1A.
Figure 1C:
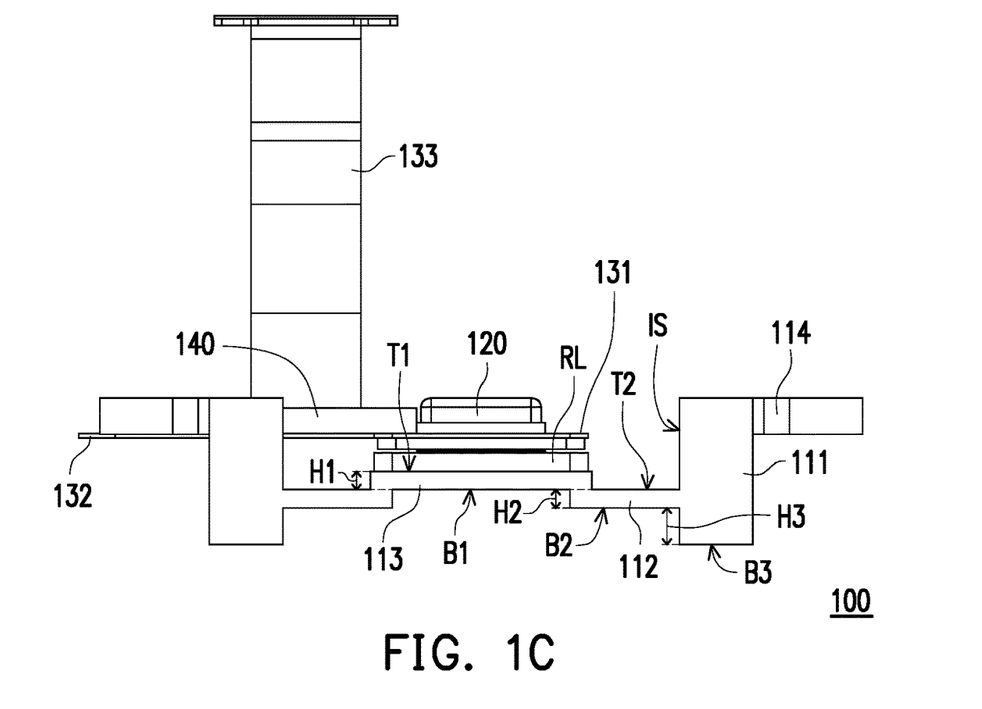
FIG. 1C is a front view of the microphone of FIG. 1A.

With reference to FIG. 1A to FIG. 1C, in an embodiment of the disclosure, a microphone 100 includes a base 110, at least one sound receiving element 120, and a flexible circuit board 130. A microphone is a transducer that converts sound waves into electronic signals, and is adapted for consumer electronic products, such as smart phones, notebook computers, and head-mounted displays. The forms of the head-mounted displays include helmet-mounted display devices, goggles-type display devices, and glasses-type display devices.

The base 110 is made of damping materials, for example but not limited to, silicone, rubber, or other materials with a damping property. To be specific, the base 110 has a plurality of supporting portions 111, a plurality of damping portions 112, and a bearing portion 113. The supporting portions 111 are spaced apart from each other. Each of the plurality of damping portions 112 is disposed on an inner surface IS of the corresponding supporting portion 111. Each of the plurality of damping portions 112 is formed as extending from the inner surface IS of the corresponding supporting portion 111 and is perpendicular to the inner surface IS. The bearing portion 113 is connected to the damping portions 112 and is suspended between the supporting portions 111.

With reference to FIG. 1A to FIG. 1C, to be specific, the bearing portion 113 is overlapped with two damping portions 112. In addition, a first height difference H1 is present between a first bottom surface B1 of the bearing portion 113 and a second bottom surface B2 of the corresponding damping portion 112. A second height difference H2 is present between a first top surface T1 of the bearing portion 113 and a second top surface T2 of the corresponding damping portion 112. Besides, a third height difference H3 is present between the second bottom surface B2 of each of the plurality of damping portions 112 and a third bottom surface B3 of the corresponding supporting portion 111. As such, the damping portions 112 support the bearing portion 113 to be suspended between the supporting portions 111.

In this embodiment, the at least one sound receiving element 120 includes one sound receiving element, and the sound receiving element 120 is disposed on the base 110. In other embodiments, the at least one sound receiving element includes, but is not limited to, a plurality of sound receiving elements.

Besides, since a suspended structure is employed for the bearing portion 113 to prevent a direct contact with a casing of an electronic product, this greatly reduces vibration received by the sound receiving element 120 from the casing, thereby reducing noise derived from the vibration. Furthermore, the base 110 has a damping property. When vibration is transmitted to the base 110, the vibration can be absorbed through the two damping portions 112, which also prevents the sound receiving element 120 from interference, thereby improving the sound receiving quality of the sound receiving element 120.

The flexible circuit board 130 is disposed on the base 110 and has a connection segment 131, a first transmission segment 132, and a second transmission segment 133. The connection segment 131 is disposed on the first top surface T1 of the bearing portion 113 and is electrically coupled to the first transmission segment 132. The first transmission segment 132 is electrically coupled to the sound receiving element 120, and is used to transmit an electronic signal converted by the sound receiving element 120 to the second transmission segment 133. The second transmission segment 133 is adapted to be connected to a sound source port of an electronic product, and transmit the electronic signal to the corresponding electronic component of the electronic product through the sound source port to perform, for example, voice control, recording, voice recognition, or other functions.

With reference to FIG. 1B and FIG. 1C, the connection segment 131 of the flexible circuit board 130 is disposed on the first top surface T1 of the bearing portion 113. The sound receiving element 120 is disposed on the connection segment 131 and is supported by the bearing portion 113. Besides, the bearing portion 113 has a rigid layer RL. The rigid layer RL is located on the first top surface T1 of the bearing portion 113. The connection segment 131 of the flexible circuit board 130 is disposed on the rigid layer RL. The rigid layer RL may serve as an adhesive region of the bearing portion 113 and increase the overall rigidity of the bearing portion 113, so that the sound receiving element 120 can be firmly positioned on the bearing portion 113.

With reference to FIG. 1A and FIG. 1B, the first transmission segment 132 of the flexible circuit board 130 has a plurality of bending sections, a first linear section L1, a second linear section L2, a third linear section L3, and a fourth linear section L4. The bending sections include a first bending section C1, a second bending section C2, a third bending section C3, and a fourth bending section C4.

The first linear section L1 is connected between the connection segment 131 of the flexible circuit board 130 and the first bending section C1. The second linear section L2 is connected between the first bending section C1 and the second bending section C2. The third linear section L3 is connected between the second bending section C2 and the third bending section C3. In addition, the fourth linear section L4 is connected between the third bending section C3 and the fourth bending section C4. The first linear section L1 and the base 110 are perpendicular to each other. The second linear section L2 extends from the end of the first linear section L1 away from the base 110 and is parallel to the base 110. The third linear section L3 extends from the end of the second linear section L2 away from the first linear section L1 and is parallel to the first linear section L1. The fourth linear section L4 extends from the end of the third linear section L3 away from the second linear section L2 and is parallel to the second linear section L2.

Accordingly, the first linear section L1 and the third linear section L3 are parallel to each other. The second linear section L2 and the fourth linear section L4 are parallel to each other. The first linear section L1 and the third linear section L3 are perpendicular to the second linear section L2 and the fourth linear section L4. In addition, the length of the second linear section L2 is greater than the length of the fourth linear section L4. Since the first transmission segment 132 of the flexible circuit board 130 has the plurality of bending sections (C1 to C4), and forms the first linear section L1, the second linear section L2, the third linear section L3, and the fourth linear section L4 which are sequentially perpendicular to each other, the flexible circuit board 130 has a flexible property. When vibration is transmitted to the first transmission segment 132 along the second transmission segment 133, the bending sections (C1 to C4) prevents straight-line transmission of the vibration to the base 110 and the sound receiving element 120, to reduce noise derived from the vibration.

With reference to FIG. 1A to FIG. 1C, the flexible circuit board 130 also has an expansion segment 134. The expansion segment 134 is connected between the first transmission segment 132 and the second transmission segment 133. The width of the expansion segment 134 is greater than the width of the first transmission segment 132 and the width of the second transmission segment 133. The microphone 100 also includes a signal processing element 140. The signal processing element 140 is disposed on the expansion segment 134 of the flexible circuit board 130 and is electrically coupled to the sound receiving element 120 through the first transmission segment 132. The signal processing element 140 is used to process the electronic signal generated by the sound receiving element 120. The signal processing element 140 is, for example but not limited to, an amplifier, a filter, a voltage regulator, or similar electronic components.

With reference to FIG. 1A to FIG. 1C, a linear length LH of the signal processing element 140 relative to the sound receiving element 120 is less than the total length of the first transmission segment 132. In this embodiment, the total length of the first transmission segment 132 extending from the connection segment 131 to the expansion segment 134 is equal to or less than 5 cm, helping reduce the volume of the microphone 100. If the total length of the first transmission segment 132 is equal to or less than 5 cm, this helps the signal processing element 140 to stably process the signal from the sound receiving element 120. For example, if the total length of the first transmission segment 132 is equal to or less than 5 cm, this helps the capacitor of the signal processing element 140 to stabilize the voltage of the sound receiving element 120. Besides, when an issue occurs in the sound receiving element 120, if the total length of the first transmission segment 132 is equal to or less than 5 cm, this helps to debug the sound receiving element 120.

With reference to FIG. 1A to FIG. 1C, the base 110 also has a plurality of fixing sections 114. Each of the plurality of fixing sections 114 is disposed on an outer surface OS of the corresponding supporting portion 111 and is opposite to the corresponding damping portion 112. Each of the plurality of fixing sections 114 has a hole OP and is adapted to be combined with a fastening element (e.g., a screw) to fasten the base 110 to a casing of an electronic device. In other embodiments, a buckle structure is employed for the fixing section to be engaged with the casing of the electronic device, thereby fixing the base to the casing of the electronic device.

Figure 1D:
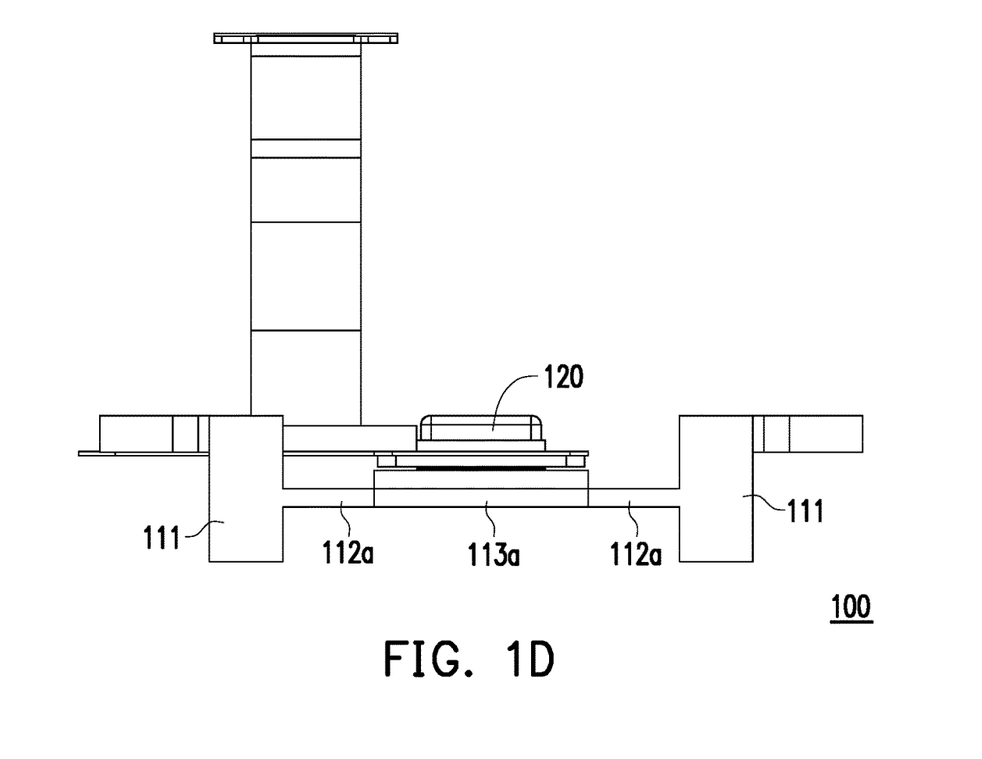
FIG. 1D is a front plan view of the microphone of FIG. 1A employing a base according to another embodiment.

With reference to FIG. 1D, in another embodiment, a bearing portion 113a and two damping portions 112a may also be integrally formed and be presented as a plate structure, which means that the bearing portion 113a and the two damping portions 112a have an equal height without a height difference.

Figure 2A:
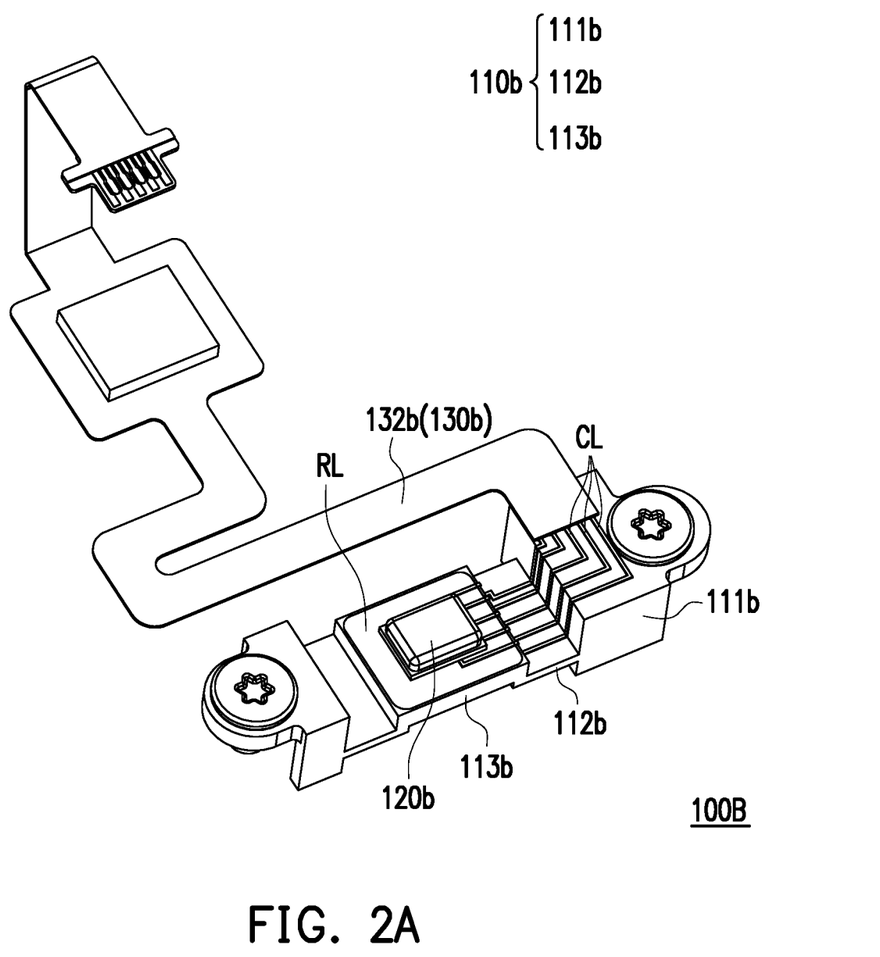
FIG. 2A is a schematic perspective view of a microphone according to another embodiment of the disclosure.
Figure 2B:
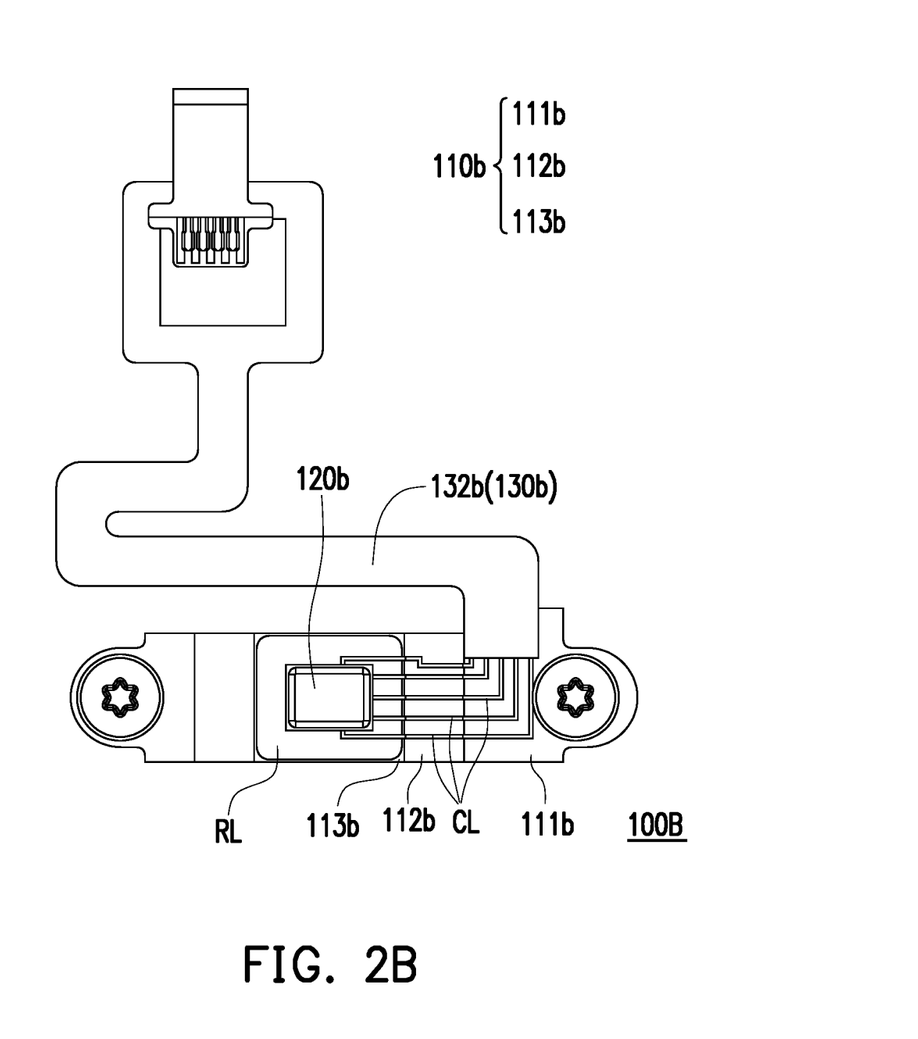
FIG. 2B is a schematic top view of the microphone of FIG. 2A.
Figure 2C:
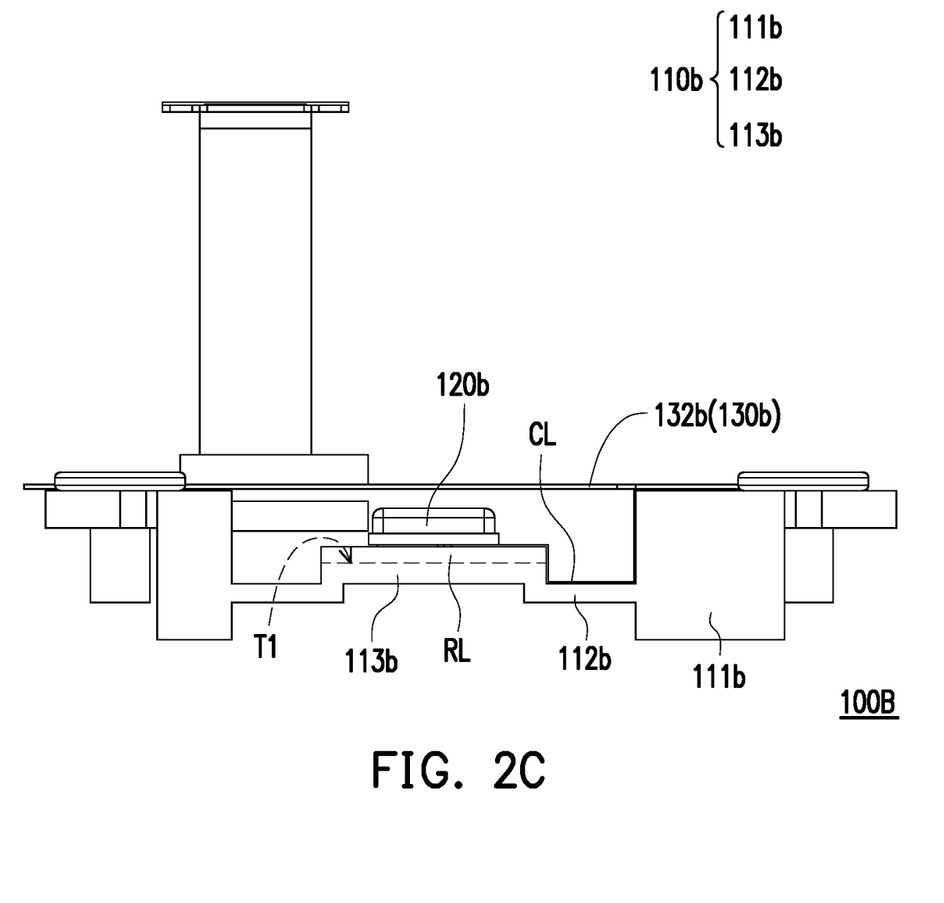
FIG. 2C is a front view of the microphone of FIG. 2A.

With reference to FIG. 2A to FIG. 2C, a microphone 100B according to another embodiment of the disclosure is different from the microphone 100 of FIG. 1A. The difference between them lies in that a first transmission segment 132b of a flexible circuit board 130b is disposed on a corresponding supporting portion 111b. A sound receiving element 120b is disposed on the first top surface T1 of a bearing portion 113b. A plurality of conductive wires CL are disposed on the bearing portion 113b, a corresponding damping portion 112b, and the corresponding supporting portion 111b, and the conductive wires CL are electrically coupled to the sound receiving element 120b and the first transmission segment 132b of the flexible circuit board 130b. In this embodiment, the sound receiving element 120b is directly fixed on the first top surface T1 of the bearing portion 113b and is connected to the conductive wires CL by welding. The sound receiving element 120b is mounted on a base 110b that absorbs vibration to thus reduce noise derived from the vibration.

With reference to FIGS. 2B and 2C, the bearing portion 113b has the rigid layer RL. The rigid layer RL is located on the first top surface T1 of the bearing portion 113b, and the sound receiving element 120b is disposed on the rigid layer RL. The rigid layer RL may serve as an adhesive region of the bearing portion 113b and increase the overall rigidity of the bearing portion 113b, so that the sound receiving element 120b can be firmly positioned on the bearing portion 113b.

Figure 3A:
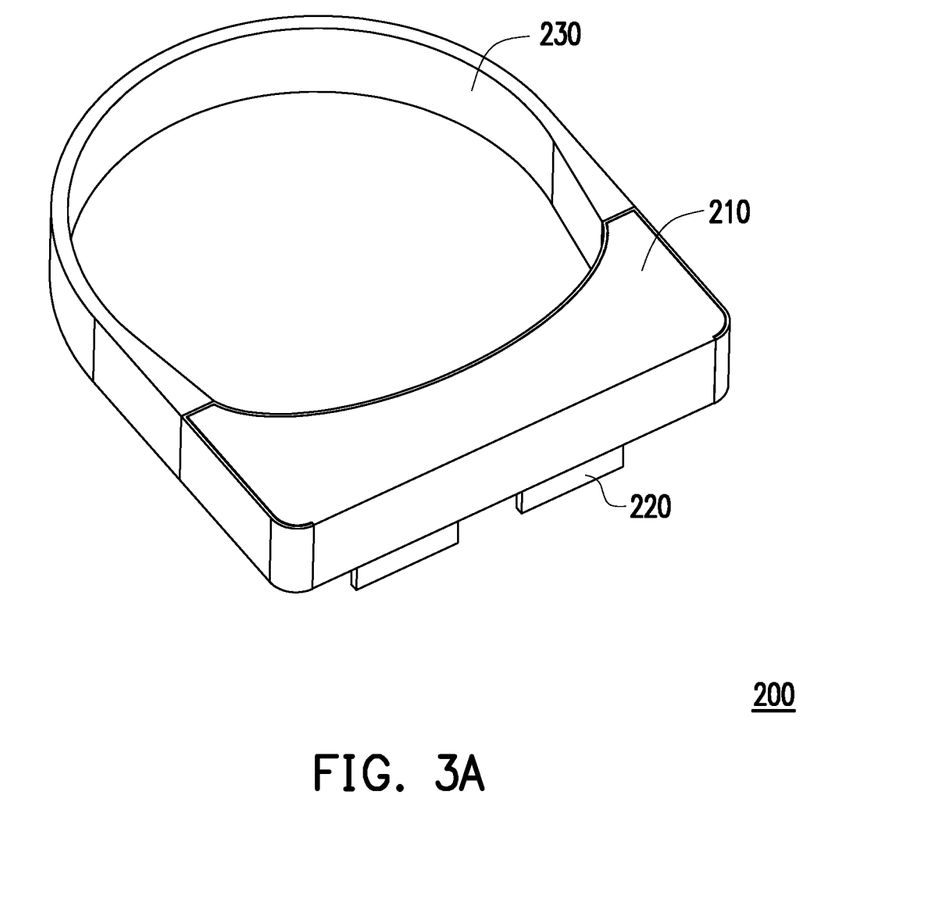
FIG. 3A is a schematic perspective view of a head-mounted display according to an embodiment of the disclosure.
Figure 3B:
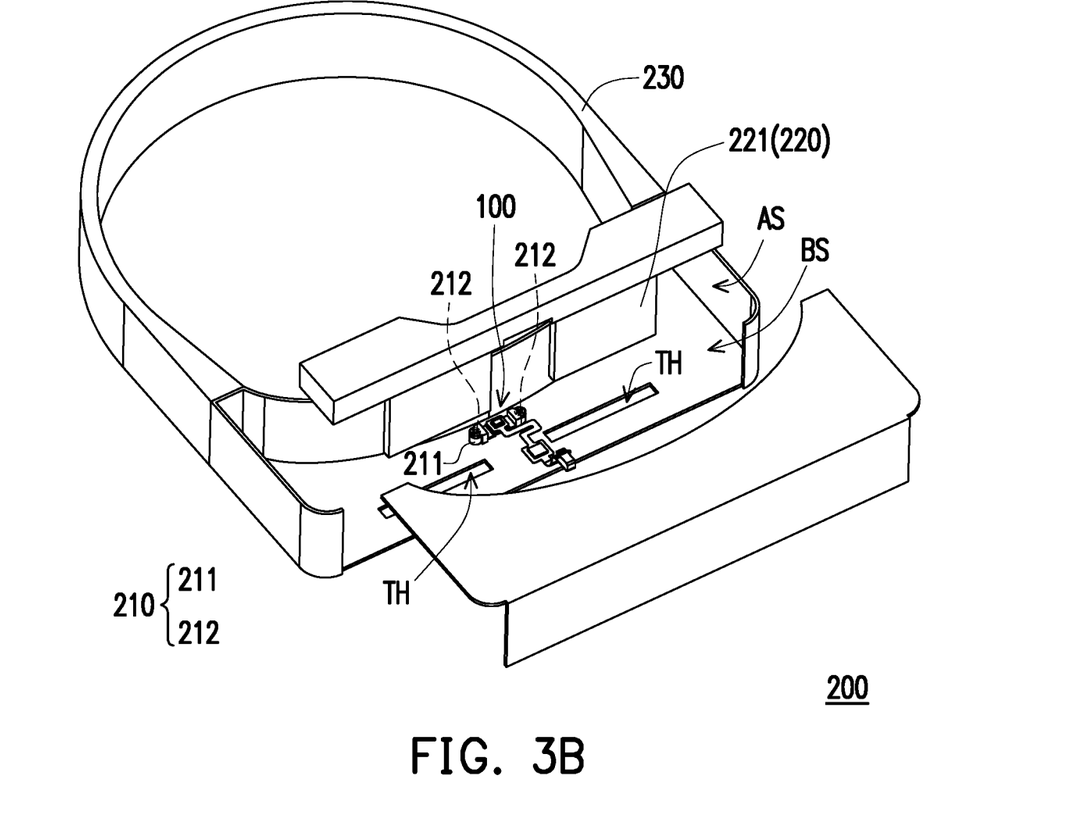
FIG. 3B is a schematic exploded view of the head-mounted display of FIG. 3A.

With reference to FIG. 3A, FIG. 3B, and FIG. 1A, a head-mounted display 200 according to an embodiment of the disclosure includes a main casing 210, a lens assembly 220, a strap assembly 230, and the microphone 100.

The main casing 210 has an accommodating space AS and two through holes TH. The two through holes TH are formed through a bottom surface BS of the main casing 210. The lens assembly 220 is disposed on the bottom surface BS of the main casing 210 and disposed through the two through holes TH. Accordingly, two lenses 221 of the lens assembly 220 protrude out of the main casing 210. The strap assembly 230 is connected to the main casing 210 to form a wearing space. The microphone 100 is disposed in the accommodating space AS of the main casing 210 and is adjacent to the lens assembly 220.

Figure 3C:
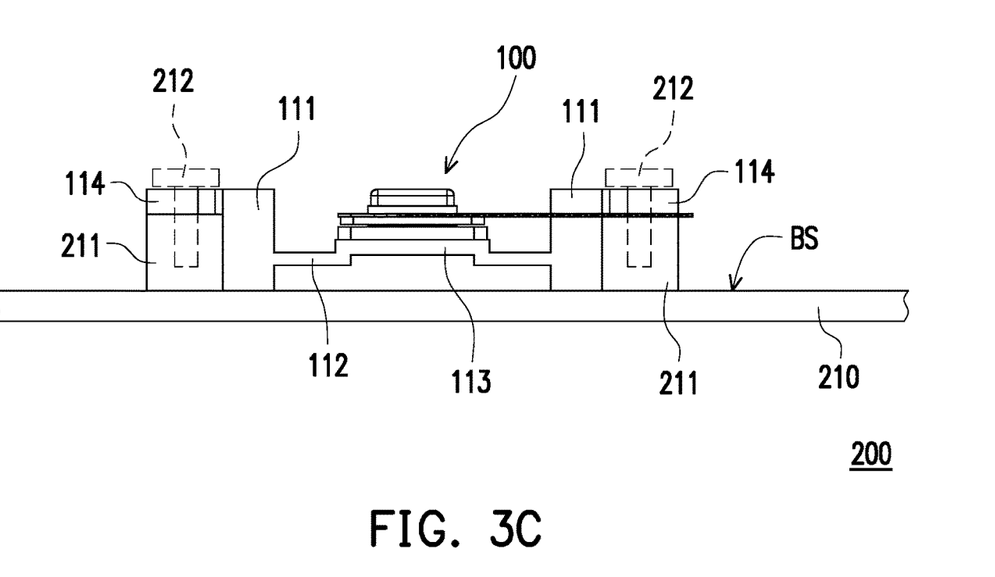
FIG. 3C is a schematic partially enlarged view of a microphone and a main casing of the head-mounted display of FIG. 3A.

With combined reference to FIG. 1A, each of the plurality of fixing sections 114 of the base 110 is disposed on the outer surface OS of the corresponding supporting portion 111 and is opposite to the corresponding damping portion 112. Each of the plurality of fixing sections 114 has the hole OP. The main casing 210 also has a plurality of fastening pillars 211 (e.g., studs) and a plurality of fastening elements 212 (e.g., screws). Each of the plurality of fastening pillars 211 is aligned with the hole OP of the corresponding fixing section 114. Each of the plurality of fastening elements 212 is disposed through the corresponding hole OP and is screwed into the corresponding fastening pillar 211 to fasten the base 110 to the bottom surface BS of the main casing 210. With reference to FIG. 3C, a spacing is present between the bearing portion 113 of the base 110 and the bottom surface BS of the main casing 210. That is, the bearing portion 113 is suspended above the bottom surface BS of the main casing 210.

In summary of the foregoing, in the disclosure, the sound receiving element is mounted on the base, so that the sound receiving element is presented in a suspended state in the base. When the microphone is mounted in the main casing of the head-mounted display, the sound receiving element may not be in direct contact with the bottom surface of the head-mounted display. Besides, the base has the plurality of damping portions, which are located on both sides of the sound receiving element. During the use of the microphone, vibration from the head-mounted display or in the environment may be absorbed by the plurality of damping portions of the base, so that the sound receiving element may not be affected by the vibration, thus reducing noise derived from the vibration.

Further, in the disclosure, the flexible circuit board having the plurality of bending sections is employed, which prevents straight-line transmission of vibration from the flexible circuit board to the sound receiving element, thus preventing the sound receiving algorithm of the microphone from interference by the vibration.

What is claimed is:

1. A microphone, comprising:
    a base, having a plurality of supporting portions, a plurality of damping portions, and a bearing portion, wherein the supporting portions are spaced apart from each other, each of the damping portions is disposed on an inner surface of the corresponding supporting portion, and the bearing portion is connected to the damping portions and is suspended between the supporting portions;
    at least one sound receiving element, disposed on the base; and
    a flexible circuit board, disposed on the base and having a first transmission segment, wherein the first transmission segment is electrically coupled to the at least one sound receiving element, and the first transmission segment has a plurality of bending sections.

2. The microphone as described in claim 1, wherein the bending sections comprise a first bending section, a second bending section, a third bending section, and a fourth bending section, the first transmission segment has a first linear section, a second linear section, a third linear section, and a fourth linear section, the first linear section is connected between the base and the first bending section, the second linear section is connected between the first bending section and the second bending section, the third linear section is connected between the second bending section and the third bending section, the fourth linear section is connected between the third bending section and the fourth bending section, the first linear section and the third linear section are parallel to each other, the second linear section and the fourth linear section are parallel to each other, and the first linear section and the third linear section are perpendicular to the second linear section and the fourth linear section.

3. The microphone as described in claim 2, wherein a length of the second linear section is greater than a length of the fourth linear section.

4. The microphone as described in claim 1, wherein the bearing portion is overlapped with the damping portions, a first height difference is present between a first bottom surface of the bearing portion and a second bottom surface of the corresponding damping portion, and a second height difference is present between a first top surface of the bearing portion and a second top surface of the corresponding damping portion.

5. The microphone as described in claim 1, wherein the bearing portion and the damping portions are integrally formed and are presented as a plate structure.

6. The microphone as described in claim 1, wherein a third height difference is present between a second bottom surface of each of the damping portions and a third bottom surface of the corresponding supporting portion, and the damping portions support the bearing portion to be suspended between the supporting portions.

7. The microphone as described in claim 1, wherein the flexible circuit board has a connection segment, the connection segment is disposed on a first top surface of the bearing portion and electrically coupled to the first transmission segment, and the at least one sound receiving element is disposed on the connection segment and is supported by the bearing portion.

8. The microphone as described in claim 1, wherein the first transmission segment is disposed on the corresponding supporting portion, the at least one sound receiving element is disposed on a first top surface of the bearing portion, a plurality of conductive wires are disposed on the bearing portion, the corresponding damping portion, and the corresponding supporting portion, and the conductive wires are electrically coupled to the at least one sound receiving element and the first transmission segment.

9. The microphone as described in claim 7, wherein the bearing portion has a rigid layer, the rigid layer is located on the first top surface of the bearing portion, and the connection segment of the flexible circuit board is disposed on the rigid layer.

10. The microphone as described in claim 8, wherein the bearing portion has a rigid layer, the rigid layer is located on the first top surface of the bearing portion, and the at least one sound receiving element is disposed on the rigid layer.

11. The microphone as described in claim 2, wherein the flexible circuit board further has a second transmission segment and an expansion segment, the expansion segment is connected between the first transmission segment and the second transmission segment, and a width of the expansion segment is greater than a width of the first transmission segment and a width of the second transmission segment.

12. The microphone as described in claim 11, further comprising:
    a signal processing element, disposed on the expansion segment of the flexible circuit board and electrically coupled to the at least one sound receiving element through the first transmission segment.

13. The microphone as described in claim 12, wherein a linear length of the signal processing element relative to the at least one sound receiving element is less than a total length of the first transmission segment.

14. The microphone as described in claim 1, wherein the base further has a plurality of fixing sections, each of the fixing sections is disposed on an outer surface of the corresponding supporting portion, and each of the fixing sections has a hole.

15. The microphone as described in claim 1, wherein a material of the base comprises rubber or silicone.

16. A microphone, comprising:
    a base, having a plurality of supporting portions, a plurality of damping portions, and a bearing portion, wherein the supporting portions are spaced apart from each other, each of the damping portions is disposed on an inner surface of the corresponding supporting portion, and the bearing portion is connected to the damping portions and is suspended between the supporting portions;
    at least one sound receiving element, disposed on the base; and
    a flexible circuit board, disposed on the base and having a first transmission segment, wherein the first transmission segment is electrically coupled to the at least one sound receiving element,
    wherein the first transmission segment comprises a first bending section, a second bending section, a third bending section, a fourth bending section, a first linear section, a second linear section, a third linear section, and a fourth linear section, the first linear section is connected between the base and the first bending section, the second linear section is connected between the first bending section and the second bending section, the third linear section is connected between the second bending section and the third bending section, the fourth linear section is connected between the third bending section and the fourth bending section, the first linear section and the third linear section are parallel to each other, the second linear section and the fourth linear section are parallel to each other, and the first linear section and the third linear section are perpendicular to the second linear section and the fourth linear section.

17. The microphone as described in claim 16, wherein a length of the second linear section is greater than a length of the fourth linear section.

18. The microphone as described in claim 16, wherein a total length of the first transmission segment is equal to or less than 5 cm.

19. A head-mounted display, comprising:
  a main casing;
  a lens assembly, disposed in the main casing;
  a strap assembly, connected to the main casing to form a wearing space; and
  a microphone, disposed in the main casing and being adjacent to the lens assembly, wherein the microphone comprises:
    a base, having a plurality of supporting portions, a plurality of damping portions, and a bearing portion, wherein the supporting portions are spaced apart from each other, each of the damping portions is disposed on an inner surface of the corresponding supporting portion, and the bearing portion is connected to the damping portions and is suspended between the supporting portions;
    at least one sound receiving element, disposed on the base; and
    a flexible circuit board, disposed on the base and having a first transmission segment, wherein the first transmission segment is electrically coupled to the at least one sound receiving element, and the first transmission segment has a plurality of bending sections.

20. The head-mounted display as described in claim 19, wherein the base further has a plurality of fixing sections, each of the fixing sections is disposed on an outer surface of the corresponding supporting portion, each of the fixing sections has a hole, the main casing has a plurality of fastening pillars and a plurality of fastening elements, each of the fastening pillars is aligned with the hole of the corresponding fixing section, each of the fastening elements is disposed through the hole of the corresponding supporting portion and is screwed into the corresponding fastening pillar, and a spacing is present between the bearing portion and the main casing.

* * * * *